United States Patent [19]

Nobi

[11] Patent Number: 5,086,269

[45] Date of Patent: Feb. 4, 1992

[54] BURN-IN PROCESS AND APPARATUS

[75] Inventor: Laszlo Nobi, Fort Collins, Colo.

[73] Assignee: Hewlett-Packard Company, Palo Alto, Calif.

[21] Appl. No.: 667,620

[22] Filed: Mar. 8, 1991

[51] Int. Cl.$^5$ .................. G01R 31/02; G01R 1/06
[52] U.S. Cl. ........................... 324/158 F; 324/158 P
[58] Field of Search ............... 324/158 F, 158 P, 73.1, 324/72.5; 219/209, 210; 361/385

[56] References Cited

U.S. PATENT DOCUMENTS

| | | | |
|---|---|---|---|
| 3,710,251 | 1/1973 | Hagge et al. | 324/158 F |
| 3,979,671 | 9/1976 | Meeker et al. | 324/158 F |
| 4,115,736 | 9/1978 | Tracy | 324/158 F |

Primary Examiner—Ernest F. Karlsen
Attorney, Agent, or Firm—Guy Kelley

[57] ABSTRACT

An integrated circuit chip 12 is temporarily associated with a plenum 16 having a fluid chamber 88 in which a heat transfer fluid 46 is circulated in order to heat or cool the chip 12 at a predetermined temperature sufficient to complete a burn-in screening of said chip.

17 Claims, 2 Drawing Sheets

BURN-IN PROCESS AND APPARATUS

FIELD OF THE INVENTION

This invention generally relates to methods and apparatus for performing burn-in, reliability screening on TAB-bonded integrated circuit chips. More specifically, it relates to burn-in screenings wherein a working fluid is employed to both deliver heat to and dissipate heat from the integrated circuit chip being screened.

BACKGROUND OF THE INVENTION

"Burn-in" is a reliability screening method used to anticipate the failure of semiconductors, e.g., integrated circuit chips, by exposing them, prior to their actual use in products, to elevated temperatures usually on the order of 125°-150° C. By exposing integrated circuit chips to such elevated temperatures, their normal "aging process" is accelerated in order to cause failure of those chips which are inherently defective. That is to say that most chips that fail will do so within the first few months of use; hence, burn-in screenings are employed to accelerate the stress conditions which will be experienced by a chip during that prospective period. Any chip that survives this burn-in screening is expected to be 99.9% failure free until it dies of "old age", earned by actual use in a product.

In the past, two different methods have been employed to burn-in screen integrated circuit chips. The first method is usually referred to as "oven burn-in." It employs an oven-like device and an air or nitrogen atmosphere wherein chips are exposed to heat and voltage stress over an extended period of time. Overheating has, however, proven to be a major problem with this method since air has poor heat transfer capabilities. That is to say that during such oven burn-in procedures, the heat needed to properly screen the integrated circuit chip cannot be dissipated to the surrounding atmosphere quickly enough to prevent damage to the chips once the chip has been heated sufficiently to conduct the burn-in screening procedure. Heat sinks are therefore employed in the operation of such burn-in ovens. However, temperature uniformity from device to device is poor. Moreover, even when heat sinks are so employed, the poor temperature stability and/or oxidation of components in the oven's atmosphere will often cause other problems. Oven burn-in reliability screening is also not practical for high-power, TAB-bonded integrated circuit chips due to their high power densities.

The other prior art burn-in reliability screening method is often referred to as "liquid immersion burn-in." It usually involves the complete immersion of the chip and a chip connector or socket —a device with which the chip needs to be associated to perform the burn-in screening procedure—into a liquid immersion bath heated to a desired temperature. Two inherent problems are generally associated with liquid immersion burn-in screenings. The first problem is that the immersion fluids—if contaminated—are likely to contaminate successive chips undergoing screening. Consequently, complex and, hence, expensive filtering systems are required for the repeated use of such baths. Furthermore, those chip connectors or sockets normally associated with such chips during liquid burn-in screenings tend to trap some of the immersion fluids in their many cavities. This causes a considerable loss of the expensive fluids or a considerable waste of time waiting for them to "drip off" once they are removed from the bath. The immersion fluids used to make up these baths are also extremely expensive. However, the liquid burn-in method does have an advantage over the oven burn-in method in that the liquid bath can also serve as a heat sink which is capable of quickly drawing heat energy away from the chip and its connector at the appropriate point in the burn-in procedure to thereby prevent any undesired overheating of the chip.

Yet another problem with both of these burn-in methods follows from the fact that the chip connector or socket, which is used to physically hold and make electrical contact with a chip during burn-in screening, and the printed circuit board that the socket is attached to, are exposed to the very same heat conditions needed to screen the integrated circuit chip. This exposure requires that the connector and circuit board be made of an expensive material and provided with special soldering for electrical connections which are capable of surviving the relatively high temperatures (e.g., 125°-150° C.) usually required to burn-in screen an integrated circuit chip. That is to say that an entire chip and connector, i.e., the connector or socket plus the chip, or the printed circuit board, will fail a burn-in in screening procedure—as opposed to failure of the chip alone—if the connector or printed circuit board themselves fail for any reason. Consequently, failure of the connector or printed circuit board requires that the reliability screening procedure be repeated for the chip associated with the connector or printed circuit board at the time of its failure. This can only be done at the considerable additional labor expense associated with removing the chip from the failed connector or socket and remounting the chip in a new connector for a repeated screening procedure.

The primary advantage of applicant's burn-in method is that it makes the burn-in screening of relatively high power, TAB-bonded integrated circuit chips feasible. This feasibility is important because, owing to the high power density in a bare chip, TAB-bonded package, oven burn-in is not practical. Immersion burn-in may work but it has the many disadvantages previously noted. By employing applicant's reliability screening procedure, PC boards do not have to be removed from the system (as in oven burn-in) and burn-in screening can be carried out for socketed integrated circuit chips in a low temperature ambient environment.

The herein described methods and apparatus avoid each of the above mentioned problems by providing a method for burn-in screening an integrated circuit chip without directly exposing its connector or the printed circuit board to the heat conditions they would otherwise encounter in a burn-in oven or in an immersion bath used to conduct liquid burn-in screening procedures. That is to say that, unlike either the oven burn-in or the liquid burn-in screening procedure, the connector and printed circuit board used in applicant's process are, to a large extent, isolated from direct contact with the source of the high temperatures needed to burn-in screen the chip. Thus, applicant's connector or socket and printed circuit boards need not be made of expensive heat-resistant materials and soldered electrical connections need not be constructed of materials capable of withstanding repeated exposure to 125°-150° C. temperatures. Consequently, a chip connector's useful life—regardless of the material used to make it and the life of the printed circuit board, are extended because they are somewhat removed from direct physical contact with the source of heat employed to screen the chip. Also, because applicant's method employs a closed loop heat transfer fluid system whose fluid never touches the chip itself, there is little or no fluid loss and/or fluid contamination. Likewise, better (e.g., more instantaneous) overall temperature control of the entire screening procedure can be achieved with applicant's burn-in screening procedure and/or apparatus.

SUMMARY OF INVENTION

Applicant's apparatus and method for performing a burn-in reliability screening of materials requiring such screening and especially upon integrated circuit chips—are based upon a temporary, highly controllable, association of the chip with the heat source and a predetermined over-voltage used to conduct the burn-in screening procedure. The heat source is a circulating heated fluid confined to a circulation system which does not include the chip or its connector. Hence, the heated fluid does not come into direct contact with either the chip or the connector. Applicant's burn-in screening procedure is carried out by: (1) temporarily associating the chip with a chip connector having electrical connections suitable for electrically interconnecting a chip being screened with a PC test board having: (a) electrical connections and test equipment means for sending electrical signals to, and receiving electrical signals from, an integrated circuit chip being screened, (b) means for electrically and physically attaching the chip connector to the PC test board and (c) an opening through which a raised head portion of a plenum projects and is thereby positioned in heat-transfer-proximity (and/or physical contact) with the chip being screened; (2) placing the chip into heat transfer proximity (including physical contact) with the plenum, (3) heating the plenum by circulating a heated fluid through a fluid chamber in said plenum; (4) electrically screening the chip after it attains a predetermined heated condition (i.e., after burn-in screening conditions are achieved); and (5) disassociating the chip from the heat provided by the heated fluid after the chip has received some predetermined quantity of heat (and/or has reached some predetermined temperature) sufficient to burn-in screen said chip. Typically, temperatures of from about 125° C. to about 150° C., employed from a few minutes to several hours, are employed. Such a predetermined quantity of heat may be detected by various temperature sensing devices known to the art.

Again, it should be specifically noted that the predetermined quantity of heat needed to conduct applicant's burn-in screening procedure may be directly or indirectly transferred from the plenum to the integrated circuit chip. That is to say that the chip may be placed in abutting contact with the plenum or merely placed in close proximity to it. Hence, for purposes of this patent disclosure, applicant's use of expressions like "heat-transfer-proximity" is meant to cover either of these two possibilities. Moreover, in a preferred embodiment of this process, the plenum may be surrounded by some select gaseous atmosphere such as helium which may serve as an interface between the chip being screened and the exterior of the plenum.

The exterior of applicant's plenum also acts as a housing for a fluid chamber through which the heat transfer fluid is circulated. The exterior surface of the plenum also, most preferably, includes a raised head portion having a flat heat transfer surface and having sufficient height to project through an opening in the PC test board used in conducting applicant's burn-in screening procedures. Most preferably, it is this flat raised head portion which comes into heat-transfer-proximity (or actual physical contact) with the integrated circuit chip being screened. Thus, the heated fluid tends to heat the entire plenum as it circulates through it, but it is the raised head portion—and more specifically its flat, top face or heat transfer surface—which constitutes the working heat transfer surface which imparts the heat needed to conduct the screening procedure. That is to say that the heat from the circulating, heated fluid is transferred to the inner walls of the plenum's fluid chamber, through its housing, and finally to the exterior surface of said housing, including the top face or exterior surface of the raised head portion of the plenum. An integrated circuit chip being screened (and especially a chip having a flat, wafer-like configuration) is preferably forced into closer proximity with the raised head of the plenum by means of certain mechanical devices hereinafter more fully described.

In some of the more preferred embodiments of applicant's process, the working, heat transfer fluid is heated in a separate tank or container and then pumped to the plenum via a closed loop, heat transfer fluid circulation system. Most preferably, the heat transfer fluid is circulated within the plenum's fluid chamber by means of a concentric piping system comprised of an inner pipe that receives and directs the heat transfer fluid into the plenum, surrounded by an outer, concentric pipe that removes said heat transfer fluid from the plenum after heat is transferred from the heated fluid to the inner surface of the plenum's fluid chamber.

In a preferred embodiment of this invention, the plenum is positioned under a hole in the PC test board used to conduct the burn-in screening procedure and the chip connector is positioned on top of the PC test board directly over the hole and the raised head portion of the plenum. However, in the most preferred embodiments of this invention, the raised head portion of the plenum projects completely through the hole in the PC test board and into an aperture in the bottom of the chip connector. The hole in the PC test board is somewhat larger than the raised head portion of the plenum. Similarly, the aperture in the connector is larger than the raised head of the plenum which also, preferably, projects into the connector's aperture. Hence, only the chip itself, and not the PC test board or the chip connector, is in direct physical contact with the heated plenum. That is to say that the space between the plenum and the edges of the hole in the test board, as well as the space between the plenum and the edges of the aperture in the connector, serve as an air gap or means of "insulating" these components from the heated plenum. At the very least, the degree of insulation provided by this gap permits the chip connector and the printed circuit board to be made from materials less expensive than those needed for oven or liquid burn-in screening procedures. This encourages a longer useful life. Moreover, any potential thermal damage to the herein disclosed system also can be readily monitored and prevented by use of applicant's "closed loop" fluid circulation system since the chip is the only component which is directly subjected to the full effect of the burn-in temperature.

DESCRIPTION OF PREFERRED EMBODIMENTS

Figure 1:
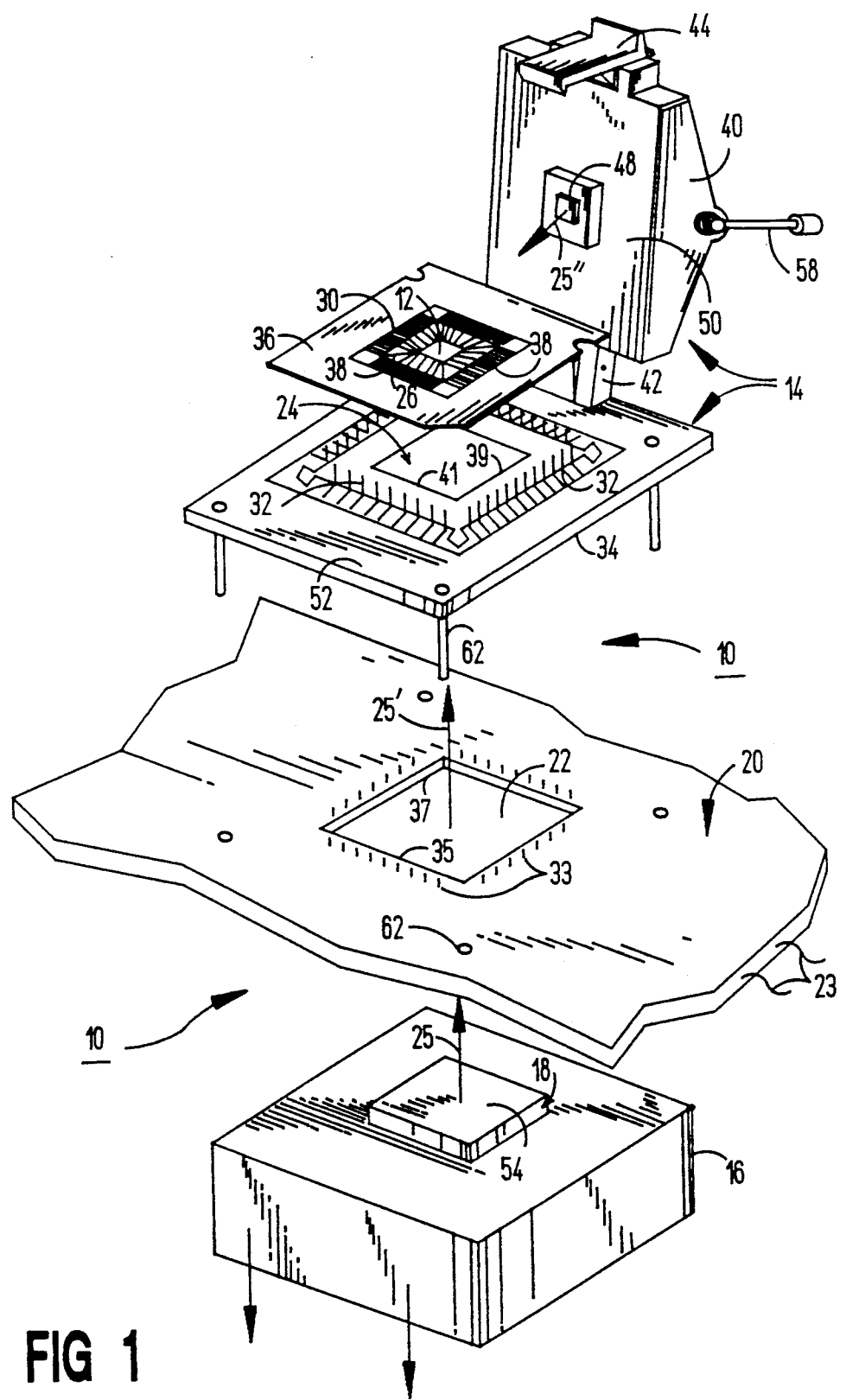
FIG. 1 is an exploded, perspective view of an integrated circuit chip, its connector or socket, a test board section and a plenum generally related to each other according to the teachings of this patent disclosure.

FIG. 1 depicts a perspective, exploded view of a burn-in screening system 10 comprised of an integrated circuit chip 12, and a chip connector or socket 14 having a preferred "hinged lid, box-like" or "clamshell" configuration which is shown in an "open" position to receive the chip 12 to be screened. While the "clamshell" configuration of the connector is a preferred embodiment, other types of chip connectors or sockets can obviously be employed. A plenum 16 having a raised head portion 18 is depicted as being located underneath a PC test board 20 having a hole 22 therein. The arrow 25' depicts the fact that the raised head portion 18 of plenum 16—when the system 10 is assembled—is intended to project completely through the hole 22 of PC test board 20. The raised head portion 18 also is intended to project into an aperture 24 in the chip connector 14. Preferably, the chip connector 14 is mounted to the PC test board 20 above hole 22 in order to permit said raised head portion 18 of plenum 16 to come into close proximity (and/or abutting contact) with the chip 12 being screened.

The integrated circuit chip 12 to be burn-in screened is preferably centrally mounted on a piece of film 26 and provided with electrical leads 30 for connecting the chip 12 to a cooperating array of electrical leads 32 provided on a base portion 34 of the chip connector 14. The PC board 20, in turn has an array of electrical leads 33 which physically and electrically cooperate with the electrical leads 32 of the base portion 34 of the chip connector 14. The resulting combination of such leads permits electrical connections to be made between the chip 12, the chip connector 14, the test board 20, and, ultimately, via PC test board leads 33, and the electrical test equipment (not shown) normally used to determine the success or failure of the burn-in screening procedure.

The film 26 is preferably removably attached to the underside of a chip carrier frame 36 having a central opening 38 in which the film 26—and hence the integrated circuit chip 12 attached to it—is centrally positioned. That is to say that the central opening 38 of the carrier frame 36 is located such that, when the system 10 is assembled, the film 26 and chip 12 are more or less centrally positioned above the central aperture 24 provided in the base 34 of the chip connector 14 (i.e., as shown in the side, cut-away view of FIG. 2). As previously noted, the chip connector or socket 14 preferably has a "hinged" lid, box-like, configuration comprised of a lid portion 40 and the base portion 34 connected together via hinge 42 to create an apparatus capable of being readily opened and closed for insertion and removal of the carrier frame 36 and hence a chip 12 being screened. In effect, a new integrated circuit chip is screened when a new frame 36 is inserted into the chip connector 14. The chip connector 14 also is provided with a clamp 44 for locking the base 34 and the lid 40 of the connector 14 together once the chip 12 is inserted therein for screening.

Figure 2:
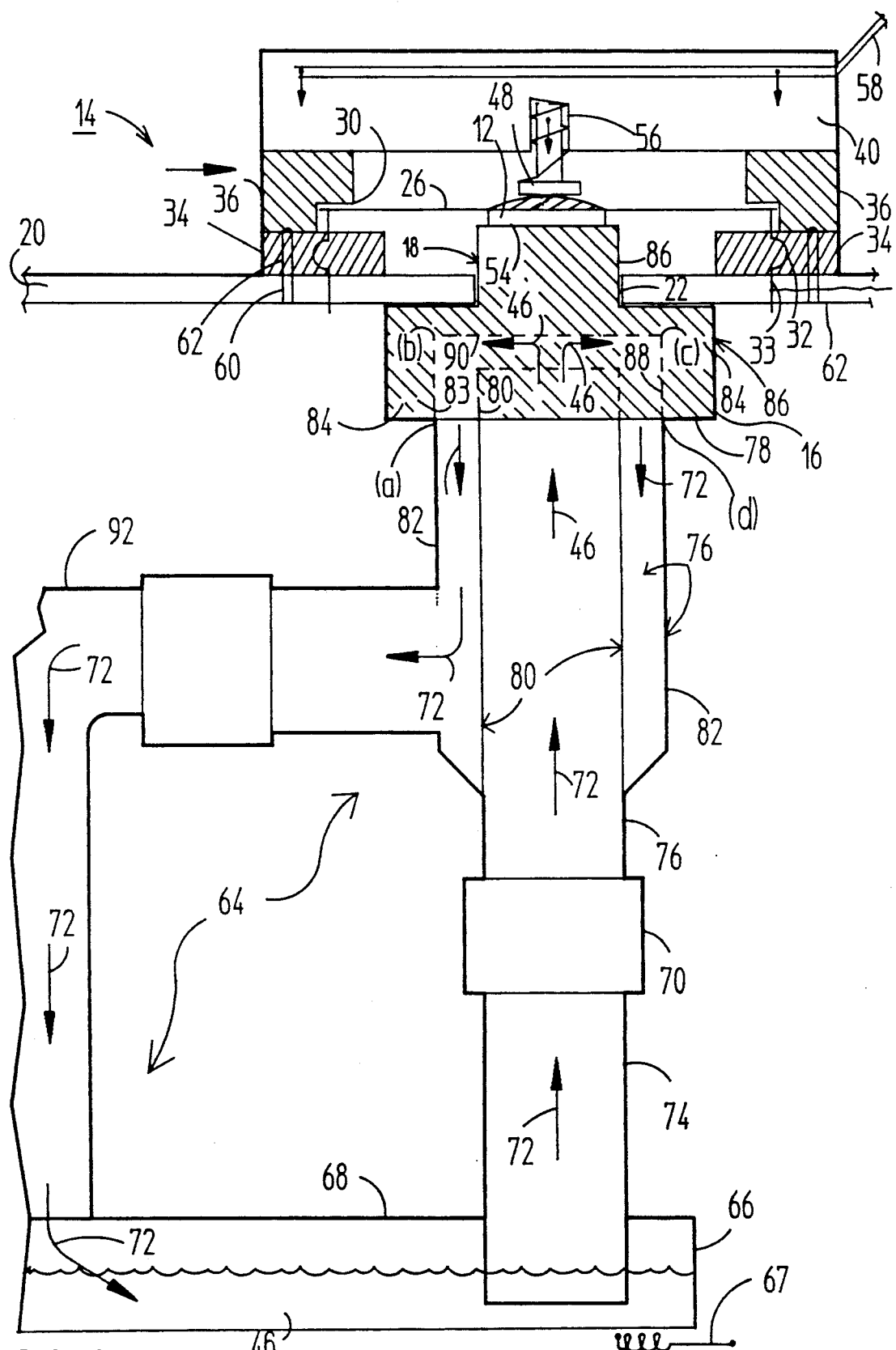
FIG. 2 is a cross section view showing the chip, its connector, the PC test board and the plenum of FIG. 1, along with the plenum's associated closed loop heat transfer fluid system, all arranged in a preferred working arrangement for conducting applicant's burn-in screening procedure.

Again, in actual operating position (e.g., as depicted in FIG. 2), the raised head portion 18 of the plenum 16 projects through the hole 22 in test board 20 and into the aperture 24 in the base 34 of the chip connector 14. When so adapted and arranged, the raised head portion 18 of the plenum 16 is made smaller than the hole 22 of the PC test board 20 in both length and width so that the raised head portion 18 does not contact the inside edges 35 and 37 of the PC test board 20. Similarly, the raised head portion 18 should also be small enough in both length an width so as to not come into contact with the inside edges 39 and 41 of the aperture 24 in the base 34 of the connector 14. Thus only the chip 12 is placed in close proximity (or contact) to the raised head portion 18 of the plenum 16. Consequently, heat from a heated fluid 46 (the heat transfer fluid) which is circulated into and out of plenum 16 will be conducted from the plenum 16 to the chip 12, but not fully conducted to the PC test board 20 or to the base 34 of the connector 14. Thus, the resulting "gap" or space serves as a heat insulator which serves to protect these components from the full effect of the heat generated by the plenum 16. A small gap will generally suffice to give the degree of heat insulation needed to protect the PC test board 20 and base 34.

It is also important to note that in a preferred embodiment of this invention the close proximity (and/or abutting contact) between the chip 12 and the raised portion 18 of the plenum 16 is preferably achieved through the use of a biased plunger head 48 hereinafter more fully described. The plunger head 48 forms a part of the underside 50 of the lid 40 of the chip connector 14. Thus, when the lid 40 is closed down upon and secured to the top surface 52 of the base portion 34 of the chip connector 14 (e.g., through the use of the hinge 42 which interconnects the base 34 and lid 40 and the latch 44), the plunger head 48 is forced down into opening 38 of the carrier frame 36 (see arrow 25") which is "sandwiched" between the top surface 52 of the base portion 34 and the lid 40 of the chip connector 14—thereby forcing the chip 12 into contact, or at least into closer proximity, with the raised head portion 18 of plenum 16 in the manner generally depicted in FIG. 2. Preferably, the raised portion 18 of the plenum 16 is provided with a flat, heat transfer surface 54 which has a size (i.e., surface area) that it is at least as large in both length and width as surface area of the chip 12 being screened so that the chip 12 will be uniformly heated during burn-in screening.

As shown in FIG. 2, the plunger head 48 which is normally biased downward by a biasing means such as a spring 56. The plunger head 48 is preferably centrally positioned in direct alignment with the chip 12 in order to force the integrated circuit chip 12 into physical, abutting, contact depicted in FIG. 2 with the flat, heat transfer surface 54 of the raised head portion 18 of plenum 16. When the plunger head 48 is so biased against said chip 12 (e.g., by the closing of the lid 40), both the chip 12 and the film 26 upon which said chip 12 is mounted, are both slightly biased toward, and even into, the central aperture 24 provided in the base 34, and most preferably placed in abutting contact with the plenum's heat transfer surface 54. After the burn-in screen is completed, the chip carrier frame 36 and hence the film 26 and chip 12 which are mounted therein, are removed from the chip connector 14. The film 26 having the chip 12 mounted thereon is then cut out and employed as an "aged" or "screened" chip. A new burn-in screening procedure starts with the insertion of a new chip carrier frame 36, carrying a new chip, into the chip connector or socket 14.

Again, FIG. 2 shows the overall working relationships of the most important components of applicant's burn-in screening system 10. The chip connector 14 containing the integrated circuit chip 12 being screened is shown associated—preferably by actual physical contact—with the flat heat transfer surface 54 of plenum 16 by means of the plunger head 48 and its associated biasing means 56 which are brought to this working position by closure of the lid 40 to the top surface 52 of the base 34. The lever 58 serves to press the film's electrical leads 30 against the electrical contacts or leads 32 in the socket 14 to insure a good electrical connection so that an accurate screening of the integrated circuit chip can be performed.

The chip connector 14 is preferably attached to the PC test board 20 by mounting means 60 such as screws 62. Again, the PC test board 20 is provided with a hole 22 sized such that it will readily pass the raised head portion 18 of the plenum 16. The chip connector or socket 14 is most preferably also attached to the PC test board 20 such that the hole 22 in the PC test board 20 is axially aligned (as suggested by arrows 25 and 25') with the central aperture 24 provided in the base 34 of the chip connector 14. As indicated in FIG. 2, the raised head portion 18 of plenum 16 projects completely through the hole 22 in the PC test board 20. Preferably, the raised head portion 18 also projects into the central aperture 24 provided in the base 34 of the connector 14. Thus, when the lid 40 is closed, the chip 12 is temporarily forced by the plunger 48 into close proximity (or into direct contact) with the flat, heat transfer surface 54 of the plenum 16 such that heat transfer communication is established between the chip 12 and said heat transfer surface 54. That is to say that—once the chip carrier frame 36 is loaded into the chip connector 14, and the lid 40 closed—the actual burn-in screening of the chip 12 is ready to proceed.

As shown in FIG. 2, applicant's burn-in screening system 10 employs a "closed loop" fluid system 64 which includes a fluid reserve tank 68 containing a reservoir 66 of heat transfer fluid 46 therein. The heat transfer fluid 46 is heated by an external heater means 67 and circulated throughout the closed loop fluid system 64 under motive force provided by a pump 70. Preferably, the heat transfer fluid 46 flows in the manner generally indicated by the flow direction arrows 72 in FIG. 2. Thus, the heat transfer fluid 46 will usually be at its highest temperature as it leaves the tank 68 where it is heated by heater element 67 (preferably an electrically driven heater element) and then circulated in the manner generally indicated by outflow direction arrows 72. The heat transfer fluid 46 will be at its lowest temperature as it returns to the tank 68. The temperature of the returning fluid is obviously dependent upon the power dissipation of the integrated circuit chips being screened and whether they are being heated or cooled. As previously noted, most chip burn-in screening procedures can be successfully concluded by heating the integrated circuit chip 12 being screened from about 125° C. to about 150° C. for between 6 hours to about 48 hours.

Hence, the heater element 67 and heat transfer fluid 46 must be capable of producing such temperature conditions.

Preferably the pump 70 is connected to a first piping system 74 which extends into the reservoir 66 and which is eventually connected to a second pipe system 76 which is preferably mounted to the underside 78 of the plenum 16. This second pipe system 76 most preferably consists of an inner pipe 80 surrounded by an outer pipe 82. The inner pipe 80 and the outer pipe 82 are shown, more or less, concentrically mounted to the underside 78 of plenum 16. In the embodiment of applicant's apparatus shown in FIG. 2, the inner pipe 80 is employed to inject the heated fluid 46 into the plenum 16 and the outer pipe 82 is employed to remove said fluid after it circulates through the fluid chamber 88 of the plenum 16. Obviously, these flow patterns could be reversed in alternative pipe systems.

The plenum 16 comprises a housing 84 having an outer surface 86 which includes a raised head portion 18 having a flat heat transfer surface 54 for addressing the chip 12 to be burn-in screened. The housing 84, in effect, surrounds a fluid chamber 88 whose size is generally depicted by the corner points a, b, c, and d shown in FIG. 2. The heat transfer fluid 46 is circulated into the fluid chamber 88 in order to heat the raised head portion 18 of the plenum 16 and, ultimately, the chip 12. Again, in the preferred embodiment depicted in FIG. 2, the heat transfer fluid 46 is forced, under the motive force provided by pump 70, into the fluid chamber 88 via inner pipe 80 of the concentric pipe system 76. Consequently, the heated fluid 46, impinges against the top surface 90 of the fluid chamber 88. By this means, heat is transferred, via conduction, from the heat transfer fluid 46 and through the body or housing of the plenum 16. The plenum 16, in turn, heats the chip 12, which is shown forced into contact with the flat, heat transfer surface 54 of the raised head portion 18 of plenum 16 by means of plunger 48. The integrated circuit chip 12 is thereby heated to a given temperature and for a given period of time sufficient to burn-in screen said chip 12. Once the heat transfer fluid 46 impinges against the top surface 90 of the fluid chamber 88, its direction of fluid flow is reversed such that the heat transfer fluid is redirected into the outer concentric pipe 82 and carried away, via a return piping system 92, to the fluid reserve tank 68 as shown. Upon arriving at the tank 68, the heat transfer fluid is reheated or cooled and reused. In some preferred embodiments of this process, once the burn-in screening conditions are achieved, the heated fluid can be quickly withdrawn from the plenum's "fluid chamber 88" and/or replaced with a fluid having a lower temperature than that of the heated fluid 46 in order to quickly cool the chip 12 once it has "passed" the burn-in screening procedure.

The plenum 16 may, optionally, be provided with a gaseous atmosphere such as air, helium, etc. which also may serve as an interface between the chip and the heated, flat, heat transfer surface 54 of the plenum 16 when these elements are not in actual abutting contact. However, since different atmospheres (e.g., air, helium, etc.) will have different heat resistance values, the working temperature of the heat transfer fluid 46 may need to be adjusted to insure that the integrated circuit chip 12 will be heated to the desired burn-in temperature when such a gaseous interface is so employed. Heat sensors, exchangers and fast acting cooling devices (not shown) also may be provided to adjust and maintain the temperature of the fluid at some appropriate, and usually predetermined, level. Obviously, the systems 10 may be multiplied to form a battery of such systems and employed such that a plurality of TAB-bonded integrated circuit chips may be screened simultaneously.

Applicant's new burn-in system can also be provided with a safety system comprising a temperature sensing and control module and a system computer (not shown). That is to say that the burn-in temperature experienced by the chip and the corresponding heat transfer fluid temperatures can be constantly monitored and controlled. Thus, system control boards (not shown) may be used to provide the signals that relay this data to a system computer. They also may contain circuitry to cut power to a particular PC test board in case of a short therein and thus prevent a shut down of an entire battery of such boards in case of an isolated failure. The temperature control module itself can incorporate a fluid pump, heat exchangers and associated valves (not shown). As stated previously, the heat exchangers may also be provided with cooler means to remove heat as required and/or to keep the heat transfer fluid at some constant working temperature. It should also be noted that, for best results, the heat transfer fluid utilized should have a relatively constant viscosity at the temperatures employed, be non-corrosive and not boil at a temperature near or below the temperature employed to conduct the burn-in screening procedure. Fluorinated hydrocarbons, for example, are very suitable fluids for this purpose since they, along with other certain desirable attributes, generally have boiling points substantially above the temperatures (e.g., 150° C.) at which burn-in screening procedures are normally conducted.

While certain preferred embodiments of applicant's methods and apparatus have been described above, it should be appreciated that they are given by way of illustration only and are not intended as limitations since this patent disclosure is intended to cover all modifications, alternatives and equivalents falling within the scope and spirit of this invention as expressed by the appended claims. Thus, for example, even though this invention used one concentric pipe system as its primary example, other schemes are also contemplated as being within the teachings of this patent disclosure. Similarly, the fact that the examples were largely developed around the use of this method for the burn-in screening of integrated circuit chips, other materials requiring similar screenings can be tested via the applicant's methods and apparatus. Similar modifications are possible for many other similar apparatus and process steps of this patent disclosure.

Thus having disclosed this invention, I claim:

1. A method for performing a burn-in screening procedure upon an integrated circuit chip, said method comprising:
   (1) temporarily associating the chip with a chip connector having electrical connections suitable for electrically interconnecting a chip being screened with a PC test board having: (a) electrical connections and test equipment means for sending electrical signals to and receiving electrical signals from a chip subjected to burn-in screening, (b) means for electrically and physically attaching the chip connector to the PC test board and (c) an opening through which a raised head portion of a plenum projects and is thereby positioned in heat-transfer-proximity with the chip being screened;
   (2) employing the chip connector to place the chip in heat-transfer-proximity with the plenum;
   (3) heating the plenum by circulating a heat transfer fluid through a fluid chamber in said plenum;
   (4) electrically testing the chip after it attains a predetermined heated state sufficient to burn-in screen said chip; and
   (5) disassociating the chip from the heat provided by the heated fluid after the chip is burn-in screened.

2. The method of claim 1 wherein the chip is exposed to a temperature of from about 125° C. to about 150° C. for a time period of from about 6 hours to about 48 hours.

3. The method of claim 1 wherein the heat transfer fluid circulated in the fluid chamber of the plenum to conduct the burn-in screening procedure is a fluorinated hydrocarbon having a boiling point above 150° C.

4. The method of claim 1 which further comprises heating the chip in an atmosphere of helium.

5. The method of claim 1 which further comprises circulating the heat transfer fluid through the fluid chamber via a closed loop piping system which directs the heat transfer fluid into the plenum, circulates said fluid within the fluid chamber, removes the heat transfer fluid from the plenum once heat is transferred from the heated fluid to the plenum and returns the heat transfer fluid to a tank.

6. The method of claim 1 which further comprises circulating the heat transfer fluid through the fluid chamber via a closed loop piping system having a concentric pipe section comprised of an inner pipe for receiving the heat transfer fluid and an outer pipe for removing said heat transfer fluid.

7. The method of claim 1 which further comprises associating the chip with the plenum by temporarily mounting the chip in a chip connector having an aperture for receiving the raised head portion of the plenum which extends through the test board and into said aperture and thereby placing the chip in heat transfer proximity with the raised head portion.

8. An apparatus for performing a burn-in screening procedure upon a chip, said apparatus comprising:
   (1) a chip connector having a lid, a box-like configuration and electrical connections suitable for electrically interconnecting a chip being screened with a PC test board;
   (2) a PC test board having: (a) appropriate connections and test equipment for sending electrical signals to and receiving electrical signals from a chip subjected to burn-in screening, (b) means for attaching the PC test board to the chip connector, and (c) an opening through which a raised head portion of a plenum projects and is thereby positioned in heat-transfer-proximity with the chip;
   (3) biasing means in said lid of the box-like chip connector for placing the chip in heat-transfer-proximity with the raised head portion of the plenum;
   (4) a plenum having a fluid chamber through which a heat transfer fluid is circulated under pressure provided by a pump means;
   (5) piping means for circulating the heat transfer fluid from a tank and into and out of the fluid chamber;
   (6) pumping means for pumping the heat transfer fluid from the tank and through a heat transfer fluid circulation system; and
   (7) a heat transfer fluid circulation system which includes a tank for storing and heating the heat transfer fluid.

9. The apparatus of claim 8 wherein the piping means includes a concentric pipe system having an inner pipe for introducing the heat transfer fluid into and an outer pipe for removing said fluid from the fluid chamber of the plenum.

10. The apparatus of claim 8 wherein the box-like chip connector is comprised of a lid and a base hinged together and wherein a spring-biased plunger is provided within said lid so as to be positioned in direct alignment with the chip and thereby force the chip into heat transfer contact with the plenum.

11. The apparatus of claim 8 wherein the plenum further comprises a transfer surface having a size at least as large as the chip so that said chip will be uniformly heated throughout the burn-in screening.

12. The apparatus of claim 8 wherein the heat transfer fluid has a boiling point greater than the temperature employed to burn-in screen said chip.

13. The apparatus of claim 8 wherein said heat transfer fluid has a relatively constant viscosity at a variety of temperatures.

14. The apparatus of claim 8 wherein said heat transfer fluid also serves as a heat sink to remove heat from the plenum if a predetermined temperature is exceeded.

15. The apparatus of claim 8 which further comprises heat exchangers provided to remove heat from the heat transfer fluid in order to maintain the temperature at a level sufficient to burn-in screen said chip.

16. The apparatus of claim 8 which further comprises a temperature control module and a system computer to monitor and control the temperature at a level sufficient to burn-in screen said chip.

17. The apparatus of claim 8 which further comprises a gaseous atmosphere that serves as an interface between said chip and said plenum.

* * * * *